US011777452B1

(12) United States Patent
Luo et al.

(10) Patent No.: US 11,777,452 B1
(45) Date of Patent: Oct. 3, 2023

(54) HIGH-SPEED TRANSIMPEDANCE AMPLIFIER WITH BANDWIDTH EXTENSION FEATURE OVER FULL TEMPERATURE RANGE AND BANDWIDTH EXTENSION METHOD

(71) Applicant: XIAMEN EOCHIP SEMICONDUCTOR CO., LTD, Xiamen (CN)

(72) Inventors: Zhicong Luo, Xiamen (CN); Jinghu Li, Xiamen (CN); Riqing Chen, Xiamen (CN); Haofan Ding, Xiamen (CN); Xin Hong, Xiamen (CN); Jianhai Yu, Xiamen (CN); Hanghui Tu, Xiamen (CN)

( * ) Notice: Subject to any disclaimer, the term of this patent is extended or adjusted under 35 U.S.C. 154(b) by 0 days.

(21) Appl. No.: 18/041,203

(22) PCT Filed: Dec. 24, 2021

(86) PCT No.: PCT/CN2021/141128
§ 371 (c)(1),
(2) Date: Feb. 9, 2023

(87) PCT Pub. No.: WO2023/108793
PCT Pub. Date: Jun. 22, 2023

(30) Foreign Application Priority Data

Dec. 17, 2021 (CN) .......................... 202111555742.7

(51) Int. Cl.
*H03F 3/08* (2006.01)
*H03F 1/30* (2006.01)
(Continued)

(52) U.S. Cl.
CPC .............. *H03F 1/301* (2013.01); *H03F 1/42* (2013.01); *H03F 3/45179* (2013.01); *H03F 2200/36* (2013.01); *H03F 2200/447* (2013.01)

(58) Field of Classification Search
CPC ........................................................ H03F 3/08
(Continued)

(56) References Cited

U.S. PATENT DOCUMENTS 5,430,765 A * 7/1995 Nagahori .............. H04L 25/063
375/345
8,050,573 B2 * 11/2011 Zhang ................... H04B 10/69
398/58
(Continued)

FOREIGN PATENT DOCUMENTS

CN 102723916 A 10/2012

*Primary Examiner* — Henry Choe
(74) *Attorney, Agent, or Firm* — Novoclaims Patent Services LLC; Mei Lin Wong

(57) ABSTRACT

A high-speed transimpedance amplifier with bandwidth extension feature over full temperature range and bandwidth extension method belong to the field of integrated circuit. The present invention solves the problem existed in boosting core amplifier bandwidth technology over full temperature range. The present invention includes a preamplifier TIA, a phase splitting stage PS, a pre-driver stage Pre-Drive, an output buffer BUFF and an offset cancelation circuit OC. The preamplifier TIA adopts the gate-drain voltage cancelation technology to expand the bandwidth, so that its −3 dB bandwidth is greater than twice the closed-loop bandwidth of the first-order TIA. The pre-driver stage Pre-Drive is used to drive the output buffer BUFF. By adjusting the source-level negative feedback capacitance value of the pre-driver stage Pre-Drive circuit to generate a high-frequency gain that varies with temperature, the preamplifier TIA bandwidth differences under different temperature conditions are compensated.

9 Claims, 8 Drawing Sheets

(51) Int. Cl.
*H03F 1/42* (2006.01)
*H03F 3/45* (2006.01)

(58) Field of Classification Search
USPC ........................................ 330/308; 250/214 A
See application file for complete search history.

(56) References Cited

U.S. PATENT DOCUMENTS 8,970,300 B2 * 3/2015 Piepenstock ........ H03F 3/45497
330/307
9,030,263 B2 * 5/2015 Robinson ............. H03G 3/3084
330/308

* cited by examiner (a)

(b)

HIGH-SPEED TRANSIMPEDANCE AMPLIFIER WITH BANDWIDTH EXTENSION FEATURE OVER FULL TEMPERATURE RANGE AND BANDWIDTH EXTENSION METHOD

FIELD OF INVENTION

The present invention relates to a technology for expanding the bandwidth of a non-inductive high-speed transimpedance amplifier in the full temperature range, and belongs to the field of integrated circuits.

DESCRIPTION OF RELATED ARTS

At the receiving end of the optical fiber communication integrated circuit, it is necessary to convert the optical signal into a current signal through a photodiode (PD), and then convert the current signal into a voltage signal through a high-speed transimpedance amplifier (TIA). In application scenarios such as 4G/5G benchmarks, data centers, and 100M/Gigabit fiber-to-the-home, it is usually required that the chip work at a temperature range of −40° C. to 85° C. Changes in temperature will change the device transconductance, resistance value and capacitance value, etc., thereby changing the position of the pole-zero point of the main channel of the transimpedance amplifier, and reducing the −3 dB bandwidth, resulting in insufficient bandwidth or overshooting of the amplitude-frequency characteristic curve, causing deterioration of the eye diagram and reduction in sensitivity. As shown in FIG. 1, in the temperature range of −40° C. to 85° C., even appropriate temperature compensation technique is used, the bandwidth of the main channel of the preamplifier still varies by more than 15% and the gain still varies by more than 5%.

In order to increase the bandwidth of the core amplifier, the existing technology mainly adopts the following two methods:

FIG. 2 adopts the common inductance peaking technology to improve the bandwidth of the core amplifier, and the load inductance L1 resonates with the parasitic capacitance CO of the output node to achieve bandwidth extension. However, inductance peaking technology will significantly increase the chip area and production cost.

FIG. 3 utilizes the parasitic inductance introduced by the package bonding wire and the parasitic capacitance CD of the input port resonate near the −3 dB bandwidth of the preamplifier to increase the main channel bandwidth of the transimpedance amplifier. At the same time, the peaking network of the output stage is used to increase the high-frequency gain, compensate for the roll-off of the bandwidth of the input stage, and realize bandwidth extension. However, the high and low frequency gains of the input stage and output stage are greatly affected by temperature and process, so the full temperature performance of the transimpedance amplifier cannot be guaranteed.

SUMMARY OF THE PRESENT INVENTION

An object of the present invention is to solve the existing problems in the technology of increasing the bandwidth of the core amplifier in the full temperature range, and provides a high-speed transimpedance amplifier with bandwidth extension feature over full temperature range. The gate-drain voltage cancelation technology is used to expand the main channel bandwidth of the preamplifier; the pre-driver circuit is used to generate high-frequency gain that varies with temperature, and the bandwidth difference of the preamplifier under different temperature conditions is compensated. The full-temperature performance of the bandwidth of the high-speed transimpedance amplifier is improved, and the long-term reliability of the transimpedance amplifier circuit is ensured.

According to the present invention, a high-speed transimpedance amplifier with bandwidth extension feature over full temperature range comprises: a preamplifier TIA, a phase splitting stage PS, a pre-driver stage Pre-Drive, an output buffer BUFF and an offset cancelation circuit OC;

the preamplifier TIA comprises an amplifier-A and a transimpedance RF, the transimpedance RF is connected in parallel across an input and an output of the amplifier-A;

an output terminal TIA_OUT of the preamplifier TIA is connected to a non-inverting input terminal of the phase splitting stage PS;

a non-inverting output terminal of the phase splitting stage PS is connected to an inverting input of the pre-driver stage Pre-Drive; an inverting output terminal of the phase splitting stage PS is connected to a non-inverting input terminal of the pre-driver stage Pre-Drive;

a non-inverting output terminal of the pre-driver stage Pre-Drive is connected to an inverting input terminal of the output buffer BUFF; an inverting output of the pre-driver stage Pre-Drive is connected to a non-inverting input of the output buffer BUFF;

a non-inverting output terminal of the output buffer BUFF is simultaneously connected to an output pin OP of the transimpedance amplifier and one end of a resistor Ra, an inverting output terminal of the output buffer BUFF is simultaneously connected to an output pin ON of the transimpedance amplifier and one end of a resistor Rb;

another end of the resistor Ra is connected to an inverting input terminal of the offset cancelation circuit OC, another end of the resistor Rb is connected to a non-inverting input terminal of the offset cancelation circuit OC; an output terminal of the offset cancelation circuit OC is connected to an inverting input terminal of the phase splitting stage PS; a capacitor C is connected in parallel between the inverting input terminal and the output terminal of the offset cancelation circuit OC;

the preamplifier TIA adopts a gate-drain voltage cancelation technology to expand its bandwidth, so that its −3 dB bandwidth is greater than twice a closed-loop bandwidth of a first-order TIA, the pre-driver stage Pre-Drive is used to drive the output buffer BUFF, by adjusting a source-level negative feedback capacitance value of the pre-driver stage Pre-Drive circuit to generate high-frequency gain that varies with temperature, compensate the difference in bandwidth of the preamplifier TIA under different temperature conditions.

Preferably, the preamplifier TIA comprises NMOS transistors MN1~MN5, PMOS transistor MP1, transimpedance RF, resistors R1~R3, capacitor C1 and variable resistor VR;

a gate terminal of the NMOS transistor MN1 is simultaneously connected to an input port TINP, one end of the variable resistor VR and one end of the transimpedance RF;

a drain terminal of the NMOS transistor MN1 is simultaneously connected to another end of the variable resistor VR, one end of the resistor R1 and a source terminal of the NMOS transistor MN2;

a gate terminal of the NMOS transistor MN2 is connected to a voltage bias port VB1;

a drain terminal of the NMOS transistor MN2 is simultaneously connected to one end of the resistor R2 and a gate terminal of the NMOS transistor MN5;

a drain terminal of the NMOS transistor MN3 is simultaneously connected to another end of the transimpedance RF, a source terminal of the NMOS transistor MN5, one end of the capacitor C1, one end of the resistor R3, and an output port TIA_OUT of the preamplifier TIA;

a drain terminal of the NMOS transistor MN5 is connected to a source terminal of the NMOS transistor MN4;

a gate terminal of the NMOS transistor MN4 is simultaneously connected to another end of the resistor R3, another end of the capacitor C1 and a drain terminal of the PMOS transistor MP1;

a gate terminal of the PMOS transistor MP1 is connected to a voltage bias port VB2;

source terminals of the NMOS transistors MN1 and MN3 are connected to GND;

another end of the resistor R2, another end of the resistor R1, a drain terminal of the NMOS transistor MN4 and a source terminal of the PMOS transistor MP1 are simultaneously connected to a voltage VDD;

by gate-drain voltage cancelation technique, a voltage difference between two terminals of a gate-drain equivalent capacitance Cpex of the NMOS transistor MN5 is 0, thereby a bandwidth of a main channel of the preamplifier is increased.

Preferably, the pre-drive stage circuit Pre-Drive comprises a differential amplifier circuit with capacitive negative feedback CNF_DA and a negative temperature coefficient control voltage generation circuit V_NTC;

the differential amplifier circuit with capacitive negative feedback CNF_DA comprises NMOS transistors MN6~MN11, resistors R5~R9, MOS capacitors MNC1 and MNC2;

a gate terminal of the NMOS transistor MN7 is simultaneously connected to a voltage bias port VB5 and a gate terminal of the NMOS transistor MN8;

a drain terminal of the NMOS transistor MN7 is simultaneously connected to a gate terminal of the MOS capacitor MNC1, one end of the resistor R5, one end of the resistor R6, and a source terminal of the NMOS transistor MN11;

a drain terminal of the NMOS transistor MN11 is connected to a source terminal of the NMOS transistor MN6;

a gate terminal of the NMOS transistor MN11 is connected to a signal positive phase input port INP;

a gate terminal of the NMOS transistor MN6 is simultaneously connected to a voltage bias port VB4 and a gate terminal of the NMOS transistor MN9;

a drain terminal of the NMOS transistor MN6 is simultaneously connected to an output port OUTN and one end of the resistor R8;

a drain terminal of the NMOS transistor MN8 is simultaneously connected to a gate terminal of the MOS capacitor MNC2, another end of the resistor R5, one end of the resistor R7, and a source terminal of the NMOS transistor MN10; another end of the resistor R7 and another end of the resistor R6 are simultaneously connected to a common mode voltage terminal CFB;

a drain terminal of the NMOS transistor MN10 is connected to a source terminal of the NMOS transistor MN9;

a gate terminal of the NMOS transistor MN10 is connected to a signal inverting input port INN;

a drain terminal of the NMOS transistor MN9 is simultaneously connected to an output port OUTP and one end of the resistor R9;

MOS capacitors MNC1 and MNC2 have a common source terminal and a common drain terminal;

another ends of the resistors R8 and R9 are simultaneously connected to a power supply VDD;

source terminals of the NMOS transistors MN7 and MN8 are connected to GND;

a negative temperature coefficient control voltage generating circuit V_NTC is composed of a transistor MN12 and a positive temperature coefficient current source $I_{PTAT}$;

a gate terminal of the transistor MN12 is connected to a common mode voltage terminal CFB;

a source terminal of the transistor MN12 is connected to a source-drain common terminal C_Contrl of the MOS capacitors MNC1 and MNC2 and a positive terminal of the thermal current source $I_{PTAT}$;

a negative terminal of the thermal current source $I_{PTAT}$ is grounded;

a drain terminal of the transistor MN12 is connected to the power supply voltage VDD;

a capacitance value of a MOS capacitor of a differential amplifier circuit with capacitive negative feedback CNF_DA increases linearly with an increase of temperature, then a high-frequency peak gain of the pre-drive stage circuit Pre-Drive increases proportionally with the increase of temperature is realized;

by adjusting the negative feedback capacitor value of the pre-driver stage circuit Pre-Drive to generate high-frequency gain that changes with temperature, and compensate the bandwidth difference of the pre-amplifier TIA under different temperature conditions, a difference in an overall amplitude-frequency characteristic curve of the transimpedance amplifier becomes smaller at different temperatures, thereby achieving high bandwidth.

The present invention further provides another technical solution, a bandwidth extension method under full temperature range. The method is realized based on the high-speed transimpedance amplifier with bandwidth extension feature in the full temperature range, and the method comprises the gate-drain voltage cancelation step of the preamplifier TIA, specifically: a current injection unit composed of a cascode structure composed of NMOS transistors MN1 and MN2 and a resistor R1 is adopted to expand a bandwidth of a photoelectric interface link at an input end of the transimpedance amplifier TIA; and through the gate-drain voltage cancelation technology, an influence of the gate-drain equivalent capacitance Cpex of the NMOS transistor MN5 on the bandwidth of an output node of the preamplifier TIA is reduced, and the bandwidth of the main channel of the preamplifier is improved;

a gate voltage of the NMOS transistor MN5:

$$V_5 = V_x \cdot \frac{1 + (gm5 + gmb5) \cdot R0}{gm5 \cdot R0}$$

a source voltage of the NMOS transistor MN4:

$$V_4 = V_x \cdot \frac{gm4 \cdot (R0 + r5)}{1 + (gm4 + gmb4) \cdot (R0 + r5)}$$

where:

$V_x$ is a source voltage of MN5;

gm4, gm5 are transconductances of NMOS transistors MN4 and MN5 respectively;

gmb4, gmb5 are body transconductances of NMOS transistors MN4 and MN5 respectively;

RO is the output impedance of NMOS transistor MN3;

r5 is the internal resistance of the NMOS transistor MN5;

by designing the size of NMOS transistors MN4 and MN5 and then changing the corresponding transconductance and internal resistance so that $V_4=V_5$; a gate-to-drain equivalent capacitance Cpex of the NMOS transistor MN5=0 so as to eliminate the influence of the gate-to-drain equivalent capacitance Cpex of the NMOS transistor MN5.

Preferably, the method further comprises the steps of: adjusting a high frequency gain and pole zero position of the pre-driver stage Pre-Drive, specifically:

neglecting an influence of transistors MN6 and MN9, a transfer function of the differential amplifier circuit with capacitive negative feedback CNF_DA in the pre-driver stage Pre-Drive is:

$$H(s) = \frac{gm11}{C_L} \cdot \frac{s + \frac{1}{2R5 \cdot C_{MNC1}}}{\left(s + \frac{1 + gm11 \cdot R5/2}{2R5 \cdot C_{MNC1}}\right)\left(s + \frac{1}{R8 \cdot C_L}\right)}$$

where:

gm11 is the transconductance of the NMOS transistor MN11, $C_L$ is the output node capacitance of OUTP and OUTN, $C_{MNC1}$ is the capacitance value of the MOS capacitor;

then: the zero point of the differential amplifier circuit with capacitive negative feedback CNF_DA is:

$$\omega_z = \frac{1}{2R5 \cdot C_{NMC1}}$$

the first pole of the differential amplifier circuit with capacitive negative feedback CNF_DA is:

$$\omega_{p1} = \frac{1}{R8 \cdot C_L}$$

the second pole of the differential amplifier circuit with capacitive negative feedback CNF_DA is:

$$\omega_{p2} = \frac{1 + gm11 \cdot R5/2}{2R5 \cdot C_{MNC1}}$$

the high-frequency peak gain of the differential amplifier circuit with capacitive negative feedback CNF_DA is:

$$A0 = \frac{gm11}{1 + gm11\left(\frac{R5}{2} \middle\| \frac{1}{2C_{MNC1} \cdot s}\right)} \cdot R8$$

by changing the capacitance value of MOS capacitor MNC1, the high-frequency peak gain and zero-pole position of the pre-driver stage can be adjusted.

The advantageous effect of the present invention: The present invention provides a bandwidth extension method and a circuit suitable for the full temperature range of the high-speed transimpedance amplifier, reduces the chip area and reduces the production cost. By adjusting the source-level negative feedback capacitance value of the pre-drive circuit to generate high-frequency gain that changes with temperature, the bandwidth difference of the preamplifier under different temperature conditions is compensated, the full-temperature performance of the bandwidth of the high-speed transimpedance amplifier is improved, and the long-term operation of the chip reliability is ensured. The full temperature performance of the transimpedance amplifier has been verified by simulation results.

BRIEF DESCRIPTION OF THE DRAWINGS

FIG. 8(a) is a simplified diagram of an AC path, and FIG. 8(b) is a small signal diagram of the circuit;

DETAILED DESCRIPTION OF THE PREFERRED EMBODIMENT

Embodiment 1: This embodiment is described below with reference to FIGS. 4~11. According to this embodiment, the high-speed transimpedance amplifier with bandwidth extension feature over full temperature range comprises a preamplifier TIA, a phase splitting stage PS, a pre-driver stage Pre-Drive, an output buffer BUFF and an offset cancelation circuit OC;

the preamplifier TIA comprises an amplifier-A and a transimpedance RF, the transimpedance RF is connected in parallel across an input and an output of the amplifier-A;

an output terminal TIA_OUT of the preamplifier TIA is connected to a non-inverting input terminal of the phase splitting stage PS;

a non-inverting output terminal of the phase splitting stage PS is connected to an inverting input of the pre-driver stage Pre-Drive; an inverting output terminal of the phase splitting stage PS is connected to a non-inverting input terminal of the pre-driver stage Pre-Drive;

a non-inverting output terminal of the pre-driver stage Pre-Drive is connected to an inverting input terminal of the output buffer BUFF; an inverting output of the pre-driver stage Pre-Drive is connected to a non-inverting input of the output buffer BUFF;

a non-inverting output terminal of the output buffer BUFF is simultaneously connected to an output pin OP of the transimpedance amplifier and one end of a resistor Ra, an inverting output terminal of the output buffer BUFF is simultaneously connected to an output pin ON of the transimpedance amplifier and one end of a resistor Rb;

another end of the resistor Ra is connected to an inverting input terminal of the offset cancelation circuit OC, another end of the resistor Rb is connected to a non-inverting input terminal of the offset cancelation circuit OC; an output terminal of the offset cancelation circuit OC is connected to an inverting input terminal of the phase splitting stage PS; a capacitor C is connected in parallel between the inverting input terminal and the output terminal of the offset cancelation circuit OC;

the preamplifier TIA adopts a gate-drain voltage cancelation technology to expand its bandwidth, so that its −3 dB bandwidth is greater than twice a closed-loop bandwidth of a first-order TIA, the pre-driver stage Pre-Drive is used to drive the output buffer BUFF, by adjusting a source-level negative feedback capacitance value of the pre-driver stage Pre-Drive circuit to generate high-frequency gain that varies with temperature, compensate the difference in bandwidth of the preamplifier TIA under different temperature conditions.

Figure 1:
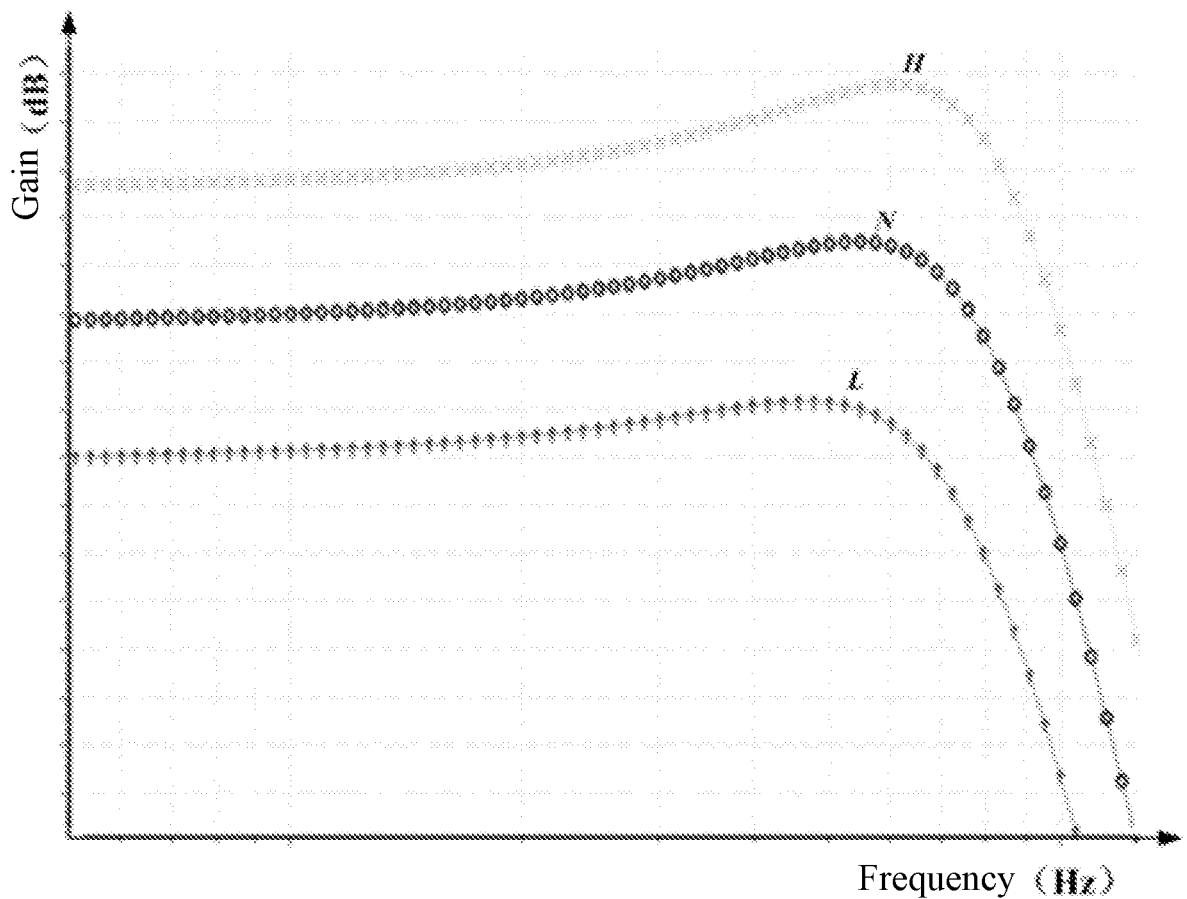
FIG. 1 is a frequency response diagram of a transimpedance amplifier using temperature compensation technology.
Figure 2:
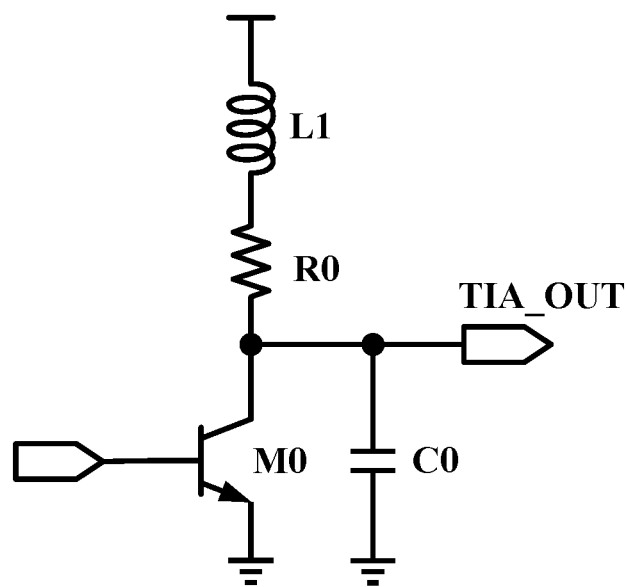
FIG. 2 is a schematic diagram of a commonly used amplifier with a load inductance.
Figure 3:
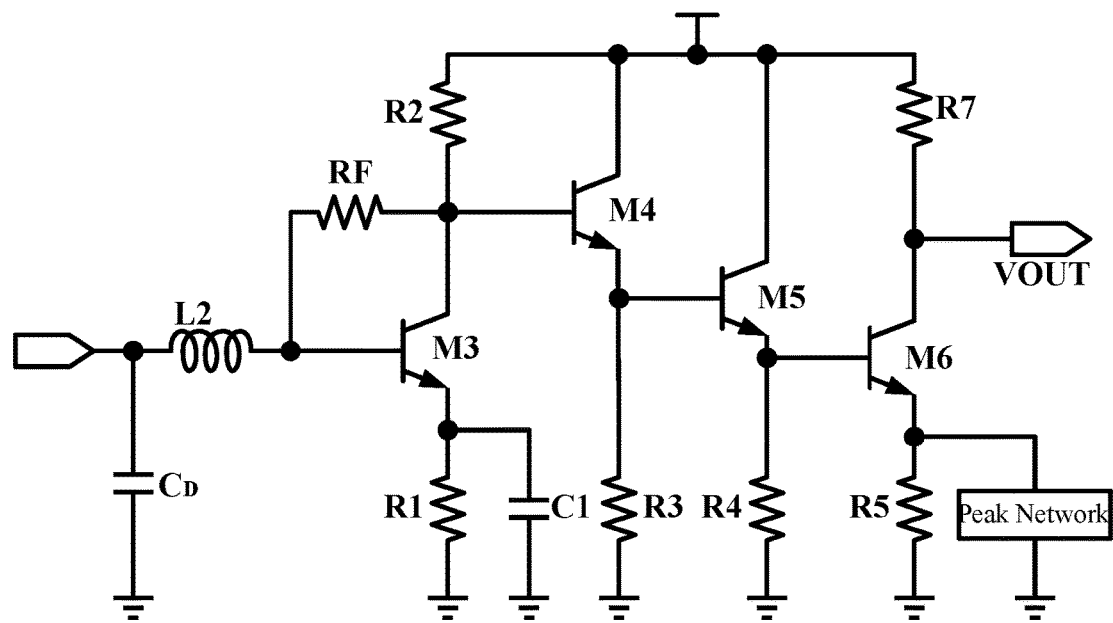
FIG. 3 a schematic diagram of the commonly used series peaking technology amplifier structure.
Figure 4:
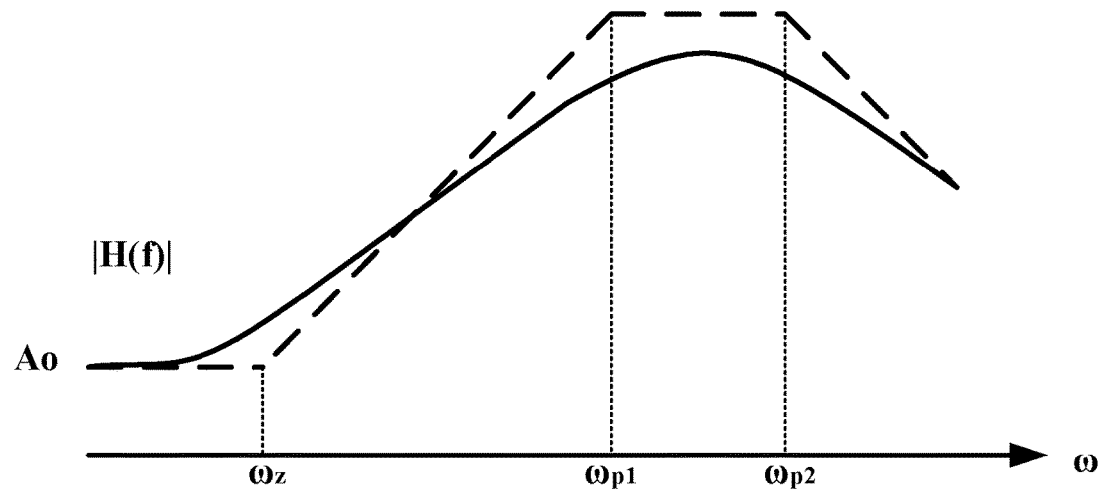
FIG. 4 is a frequency response diagram of a degenerate amplifier with a capacitor and a resistor, where the dashed line is the ideal curve and the solid line is the actual curve.
Figure 5:
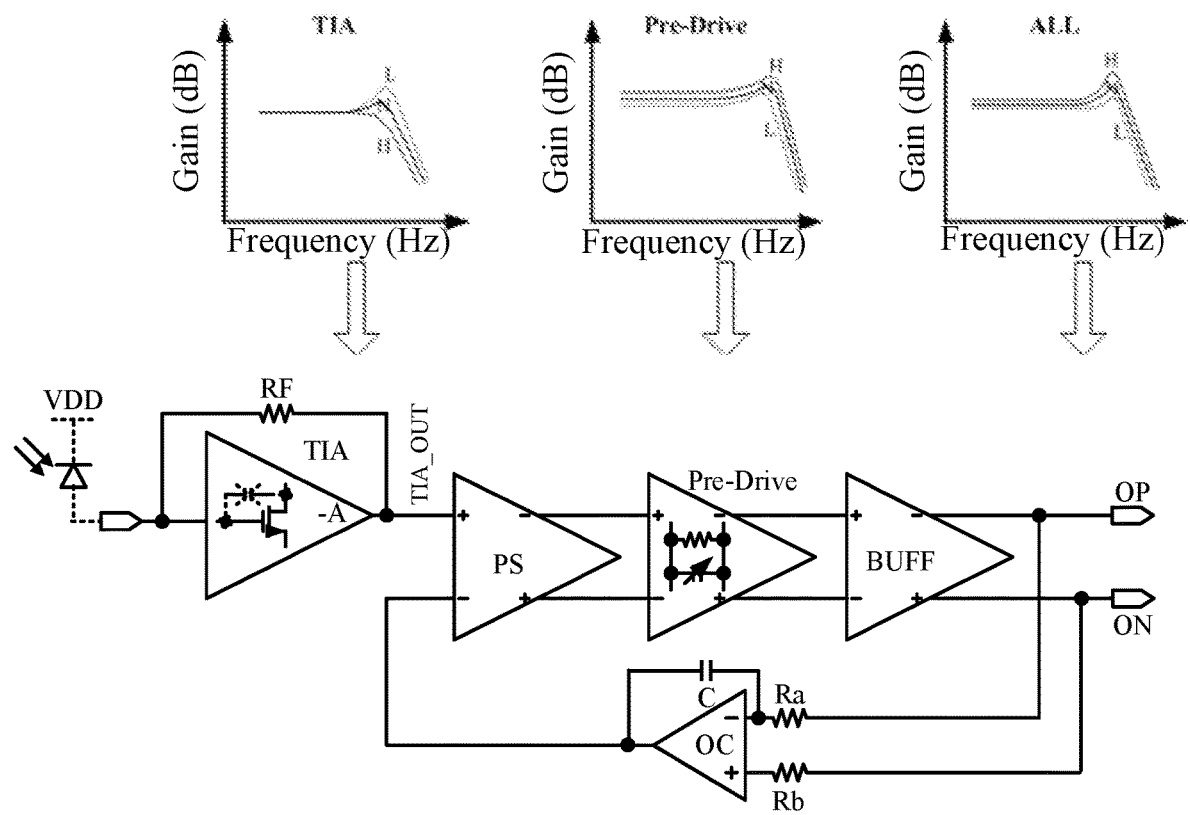
FIG. 5 is the schematic diagram of the high-speed transimpedance amplifier with bandwidth extension feature in full temperature range according to the present invention.

Referring to FIG. 5, the upper half portion is the technical principle of the bandwidth extension of the present invention, the three graphs correspond to the total output of the preamplifier TIA, pre-driver stage Pre-Drive and transimpedance amplifier respectively, each graph shows the amplitude-frequency characteristics at high (H), medium (N), and low (L) temperatures. The bandwidth and overshoot of the preamplifier under different temperature conditions are different significantly. The pre-driver stage circuit produces a high-frequency gain that varies with temperature, compensating for the bandwidth and overshoot differences of the preamplifier under different temperature conditions, thereby achieving high-quality full-temperature performance of transimpedance amplifier. In order to minimize the chip area, the present invention does not use an inductor which occupies a large area to generate frequency response overshoot to compensate for high-frequency gain roll-off caused by temperature changes and process changes. In the TIA stage as shown in FIG. 5, its bandwidth is designed to be maximized as much as possible, although the overshoot of the high-temperature frequency response curve disappears and the high-frequency gain rolls off compared to the low-temperature frequency response curve. In the pre-drive stage (Pre-Drive), the differential amplifier circuit with capacitive negative feedback CNF_DA is used as the basic structure, and the zero point $\omega_z$ is pushed to the front of the first pole $\omega_{P1}$ to generate a peak overshoot between the first pole $\omega_{P1}$ and the second pole $\omega_{P2}$ (the pre-arrival curve as shown in FIG. 4). Based on this basic structure, adding a source-level negative feedback capacitor that varies with temperature, the high-temperature frequency response curve of the pre-driver stage in FIG. 5 still appears overshoot, and the bandwidth is expanded to compensate for the loss of high-frequency gain roll-off of the TIA-level high-temperature frequency response curve. In the final output Frequency Response Curve ALL, under the full temperature range, the change of the frequency response curve is reduced.

Referring to FIG. 5, the lower half portion is a structural block diagram of a bandwidth extension circuit suitable for high-speed transimpedance amplifiers in the full temperature range of the present invention, which includes a preamplifier TIA, a phase splitting stage PS, a pre-driver stage Pre-Drive, an offset cancelation circuit OC and an output buffer BUFF. In order to avoid inter-symbol interference caused by oscillation in the step response of the TIA, the preamplifier uses the gate-drain voltage cancellation technology to expand the bandwidth, so that its −3 dB bandwidth is more than twice the closed-loop bandwidth of the first-order TIA. Compared with the traditional structure, the gate-drain voltage cancelation technology has the advantages of small area and simple structure. The pre-driver circuit is used to drive the output buffer. By adjusting the source-level negative feedback capacitance value of the pre-driver circuit, a high-frequency gain that varies with temperature is generated to compensate for the bandwidth difference of the preamplifier under different temperature conditions.

The preamplifier TIA comprises NMOS transistors MN1~MN5, PMOS transistor MP1, transimpedance RF, resistors R1~R3, capacitor C1 and variable resistor VR;

a gate terminal of the NMOS transistor MN1 is simultaneously connected to an input port TINP, one end of the variable resistor VR and one end of the transimpedance RF;

a drain terminal of the NMOS transistor MN1 is simultaneously connected to another end of the variable resistor VR, one end of the resistor R1 and a source terminal of the NMOS transistor MN2;

a gate terminal of the NMOS transistor MN2 is connected to a voltage bias port VB1;

a drain terminal of the NMOS transistor MN2 is simultaneously connected to one end of the resistor R2 and a gate terminal of the NMOS transistor MN5;

a drain terminal of the NMOS transistor MN3 is simultaneously connected to another end of the transimpedance RF, a source terminal of the NMOS transistor MN5, one end of the capacitor C1, one end of the resistor R3, and an output port TIA_OUT of the preamplifier TIA;

a drain terminal of the NMOS transistor MN5 is connected to a source terminal of the NMOS transistor MN4;

a gate terminal of the NMOS transistor MN4 is simultaneously connected to another end of the resistor R3, another end of the capacitor C1 and a drain terminal of the PMOS transistor MP1;

a gate terminal of the PMOS transistor MP1 is connected to a voltage bias port VB2;

source terminals of the NMOS transistors MN1 and MN3 are connected to GND;

another end of the resistor R2, another end of the resistor R1, a drain terminal of the NMOS transistor MN4 and a source terminal of the PMOS transistor MP1 are simultaneously connected to a voltage VDD.

Figure 6:
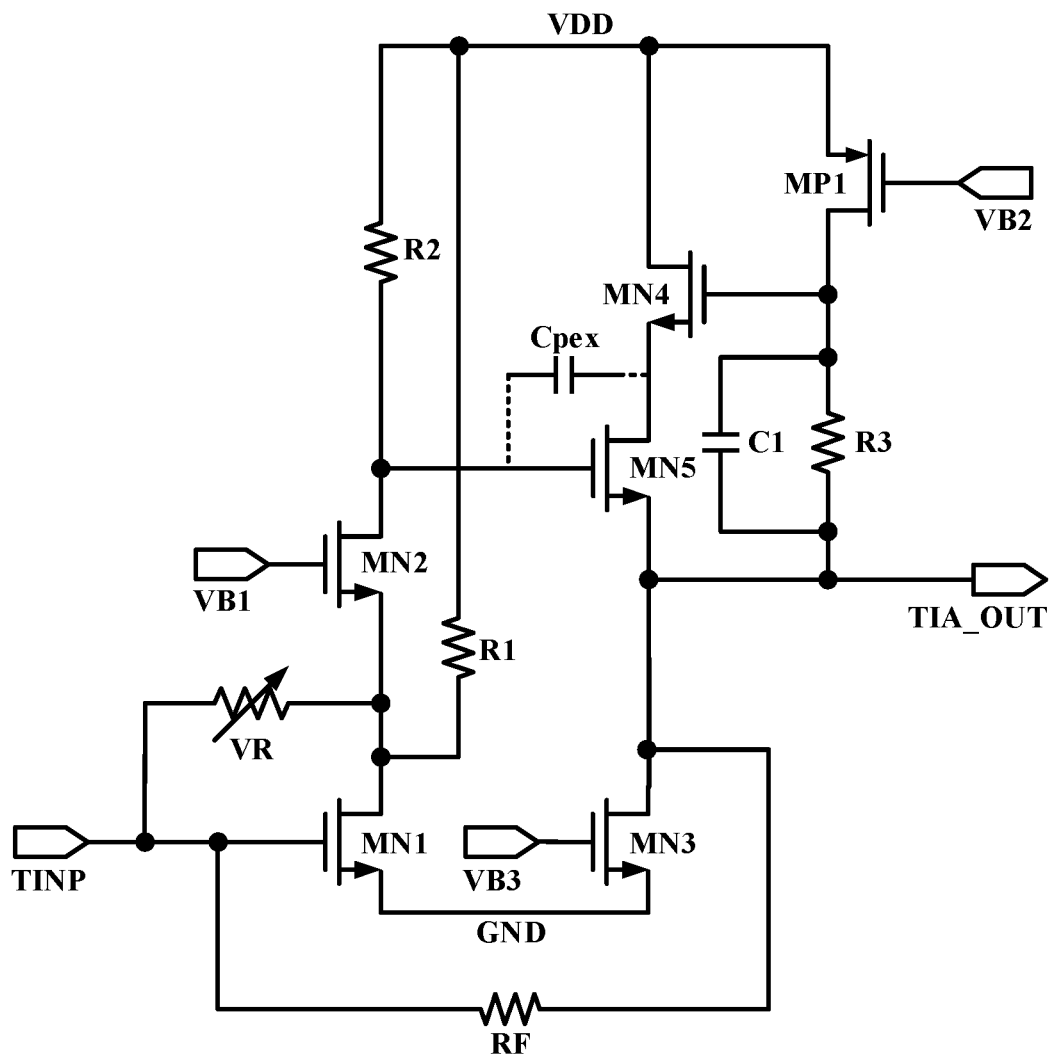
FIG. 6 is a structural schematic diagram of a preamplifier with gate-drain voltage cancelation technology.

The key point in the preamplifier circuit as shown in FIG. 6 is the gate-drain voltage cancelation technique. By using transistors NM4, MP1, capacitor C1, resistor R3 and bias voltage VB2 to form an amplifying circuit, the influence of the gate-drain equivalent capacitance Cpex of the transistor MN5 on the output node bandwidth of the preamplifier is reduced, and the main channel bandwidth of the preamplifier is increased. The method adopted in this embodiment is to make the transistor NM4, W1, capacitor C1, resistor R3 and VB2 form an amplifying circuit to reduce the voltage across the gate-drain equivalent capacitance Cpex of the transistor MN5 to be equal. When there is no voltage difference between the two ends of the capacitor, the capacitor will not be charged or discharged, and the capacitor Cpex=0. Relevant parameters are reasonably designed so that the gate-drain voltage of MN5 is equal, and the parasitic capacitance Cpex is ignored, so no Maitreya capacitance will be generated at the gate of MN5, then this technology will greatly expand the working bandwidth of the main channel of the preamplifier.

The gate-drain voltage cancellation steps of the preamplifier TIA are specifically: a current injection unit composed of a cascode structure composed of NMOS transistors MN1 and MN2 and a resistor R1 is adopted to expand a bandwidth of a photoelectric interface link at an input end of the transimpedance amplifier TIA; and through the gate-drain voltage cancelation technology, an influence of the gate-drain equivalent capacitance Cpex of the NMOS transistor MN5 on the bandwidth of an output node of the preamplifier TIA is reduced, and the bandwidth of the main channel of the preamplifier is improved;

the key components of the circuit in FIG. 6 are extracted and simplified into the AC path as shown in FIG. 8(a).

Combined with the simplified diagram of the AC path in FIG. 8(a), the small signal diagram of the gate-drain voltage cancellation technology circuit is drawn, which is shown in FIG. 8(b).

A gate voltage $V_5$ of the NMOS transistor MN5:

$$V_5 = V_x \cdot \frac{1 + (gm5 + gmb5) \cdot R0}{gm5 \cdot R0}$$

A source voltage $V_4$ of the NMOS transistor MN4:

$$V_4 = V_x \cdot \frac{gm4 \cdot (R0 + r5)}{1 + (gm4 + gmb4) \cdot (R0 + r5)}$$

where:
$V_x$ is a source voltage of MN5;
gm4, gm5 are transconductances of NMOS transistors MN4 and MN5 respectively;
gmb4, gmb5 are body transconductances of NMOS transistors MN4 and MN5 respectively;
RO is the output impedance of NMOS transistor MN3;
r5 is the internal resistance of the NMOS transistor MN5.

It can be seen from the capacitance formula C=Q/U that when there is no voltage difference between the two ends of the capacitor, the capacitor will not be charged or discharged, and the capacitance is equivalent to 0. By designing the sizes of NMOS transistors MN4 and MN5 and then changing the corresponding transconductance and internal resistance so that $V_4=V_5$, the gate-to-drain parasitic capacitance Cpex of MN5 will be ignored, so there will be no Maitreya capacitance at the gate of MN5. This technology will greatly expand the working bandwidth of the main channel of the preamplifier.

Figure 9:
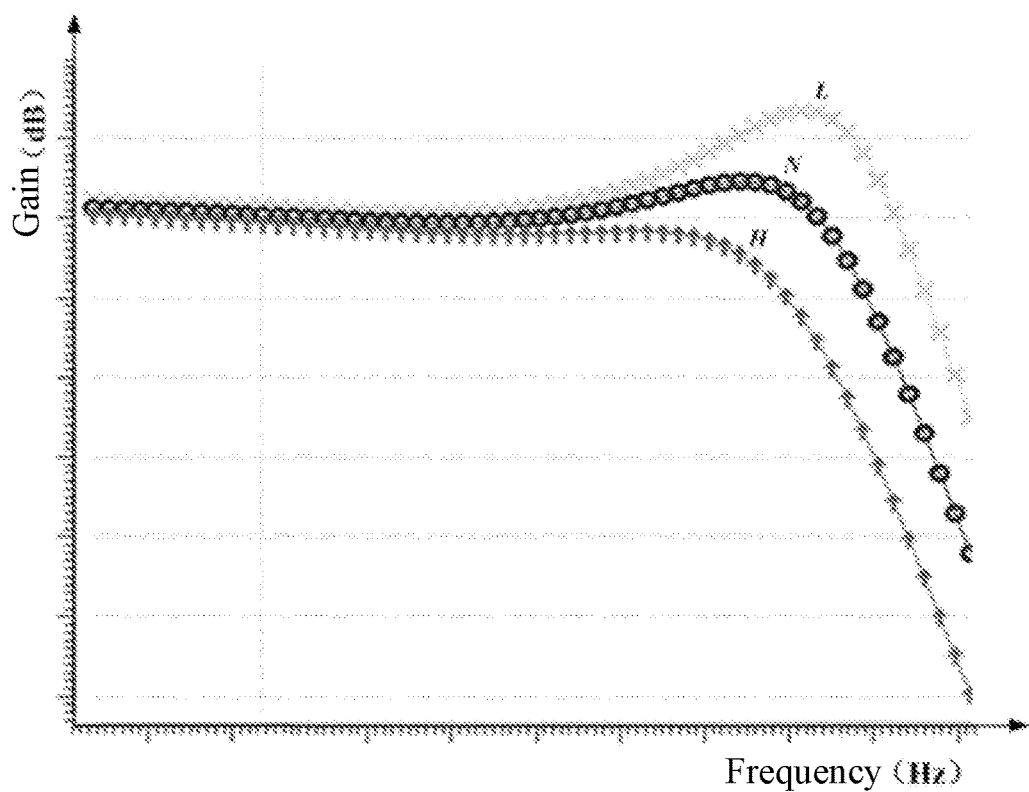
FIG. 9 is a simulation diagram showing the decrease of the overshoot bandwidth of the preamplifier as the temperature increases.
Figure 10:
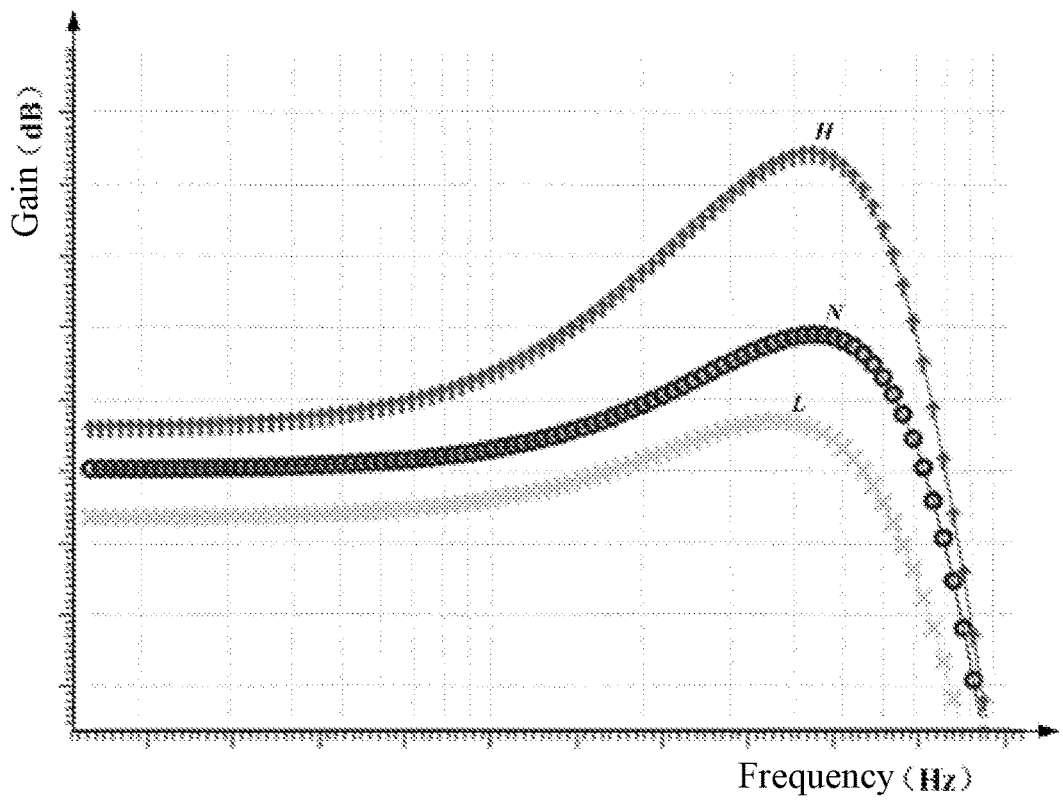
FIG. 10 is a simulation diagram showing high frequency peak gain of pre-driver stage increases proportionally with temperature increase.

However, changes in temperature will change the transconductance of transistors MN1 and MN2 and the resistance of resistor R3, etc., thereby changing the gain and pole position of the main channel of the transimpedance amplifier, resulting in overshoot differences in the amplitude-frequency characteristic curve of the preamplifier at different temperatures. As shown in FIG. 9, the simulation diagram of the overshoot bandwidth of the preamplifier decreases with the increase of temperature, the overshoot bandwidth of the low temperature (L) curve is the largest, and the overshoot bandwidth of the high temperature (H) curve is the smallest.

Figure 7:
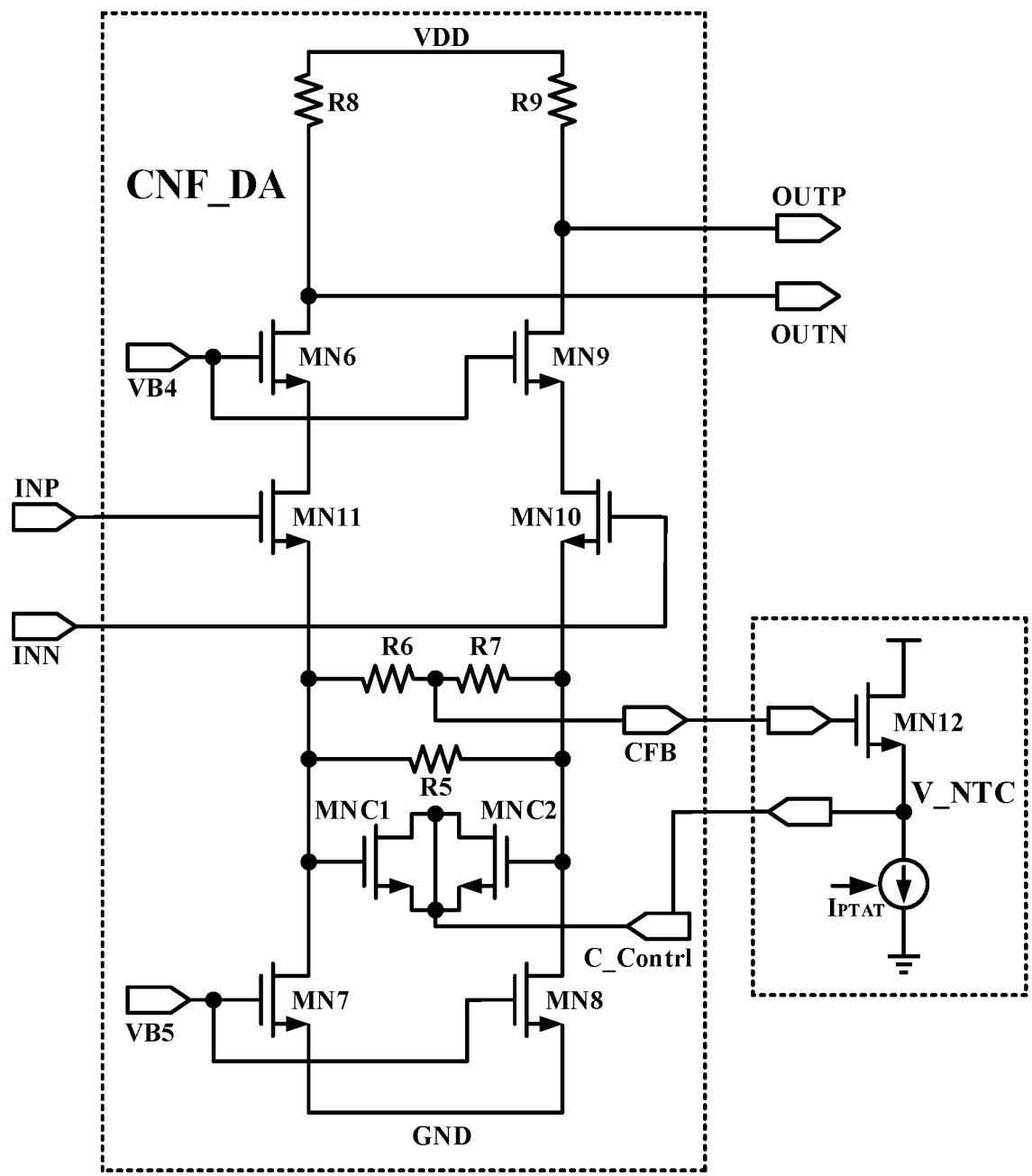
FIG. 7 is a structural schematic diagram of a pre-driver stage circuit.
Figure 8:
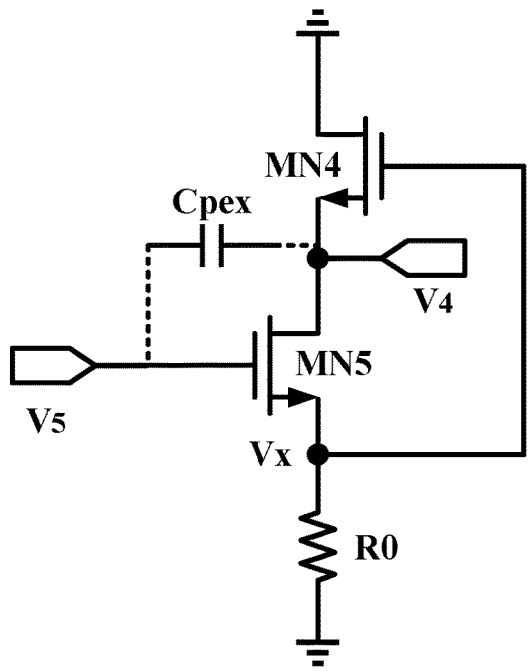
FIG. 8. is a schematic diagram of gate-drain voltage cancelation technology, where
Figure 8:
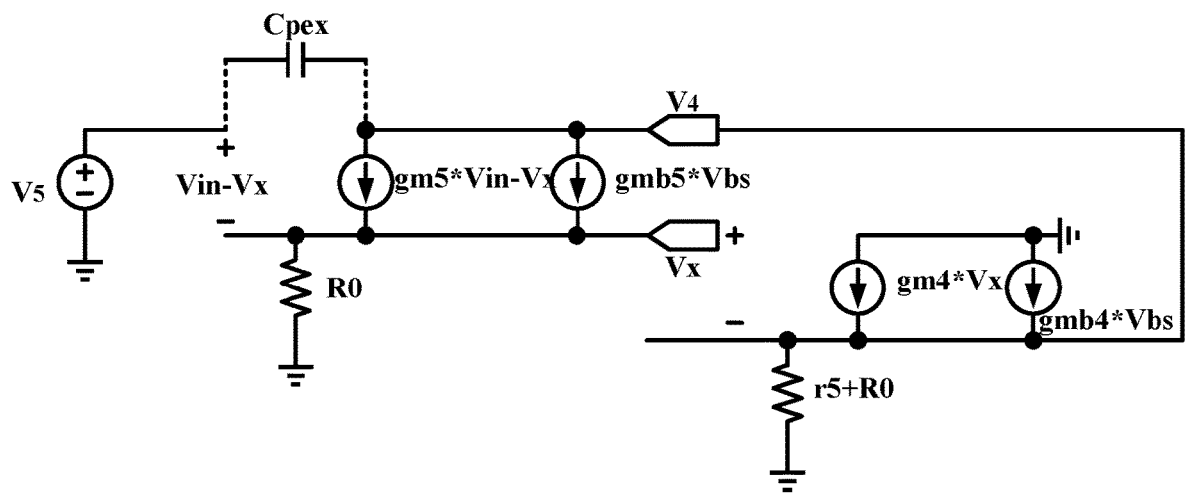

In order to compensate the overshoot and bandwidth difference in the amplitude-frequency characteristic curve of the preamplifier, improve the full-temperature performance of the bandwidth of the high-speed transimpedance amplifier, and ensure the long-term working reliability of the chip, a pre-driver stage circuit Pre-Drive is further added to the post-stage of the preamplifier TIA in this embodiment. As shown in FIG. 7, the pre-drive stage circuit Pre-Drive comprises a differential amplifier circuit with capacitive negative feedback CNF_DA and a negative temperature coefficient control voltage generation circuit V_NTC;

the differential amplifier circuit with capacitive negative feedback CNF_DA comprises NMOS transistors MN6~MN11, resistors R5~R9, MOS capacitors MNC1 and MNC2;

a gate terminal of the NMOS transistor MN7 is simultaneously connected to a voltage bias port VB5 and a gate terminal of the NMOS transistor MN8;

a drain terminal of the NMOS transistor MN7 is simultaneously connected to a gate terminal of the MOS capacitor MNC1, one end of the resistor R5, one end of the resistor R6, and a source terminal of the NMOS transistor MN11;

a drain terminal of the NMOS transistor MN11 is connected to a source terminal of the NMOS transistor MN6;

a gate terminal of the NMOS transistor MN11 is connected to a signal positive phase input port INP;

a gate terminal of the NMOS transistor MN6 is simultaneously connected to a voltage bias port VB4 and a gate terminal of the NMOS transistor MN9;

a drain terminal of the NMOS transistor MN6 is simultaneously connected to an output port OUTN and one end of the resistor R8;

a drain terminal of the NMOS transistor MN8 is simultaneously connected to a gate terminal of the MOS capacitor MNC2, another end of the resistor R5, one end of the resistor R7, and a source terminal of the NMOS transistor MN10; another end of the resistor R7 and another end of the resistor R6 are simultaneously connected to a common mode voltage terminal CFB;

a drain terminal of the NMOS transistor MN10 is connected to a source terminal of the NMOS transistor MN9;

a gate terminal of the NMOS transistor MN10 is connected to a signal inverting input port INN;

a drain terminal of the NMOS transistor MN9 is simultaneously connected to an output port OUTP and one end of the resistor R9;

MOS capacitors MNC1 and MNC2 have a common source terminal and a common drain terminal;

another ends of the resistors R8 and R9 are simultaneously connected to a power supply VDD;

source terminals of the NMOS transistors MN7 and MN8 are connected to GND.

It can be seen that the resistors R6 and R7 are used to monitor the common-mode voltage VCFB of the differential amplifier circuit with capacitive negative feedback CNF_DA in real time, which is also the gate voltage of the MOS capacitors MNC1 and MNC2. The transfer function of the differential amplifier circuit with capacitive negative feedback is (neglecting the effect of transistors MN6 and MN9, $C_L$ is the capacitance of the output node OUTP and OUTN):

$$H(s) = \frac{gm11}{C_L} \cdot \frac{s + \frac{1}{2R5 \cdot C_{MNC1}}}{\left(s + \frac{1 + gm11 \cdot R5/2}{2R5 \cdot C_{MNC1}}\right)\left(s + \frac{1}{R8 \cdot C_L}\right)}$$

From the above formula, zero point, first pole, second pole, DC gain and high-frequency peak gain can be obtained. The amplitude-frequency characteristic curve is shown in FIG. 4. By changing the capacitance value of MNC1, the high-frequency gain and zero-pole position of the pre-driver stage can be adjusted.

In the formula:
gm11 is the transconductance of the NMOS transistor MN11,
$C_L$ is the capacitance of output node OUTP and OUTN,
$C_{MNC1}$ is the capacitance value of the MOS capacitor;
then: the zero point of the differential amplifier circuit with capacitive negative feedback CNF_DA is:

$$\omega_z = \frac{1}{2R5 \cdot C_{NMC1}}$$

the first pole of the differential amplifier circuit with capacitive negative feedback CNF_DA is:

$$\omega_{p1} = \frac{1}{R8 \cdot C_L}$$

the second pole of the differential amplifier circuit with capacitive negative feedback CNF_DA is:

$$\omega_{p2} = \frac{1 + gm11 \cdot R5/2}{2R5 \cdot C_{MNC1}}$$

the high-frequency peak gain of the differential amplifier circuit with capacitive negative feedback CNF_DA is:

$$A0 = \frac{gm11}{1 + gm11\left(\frac{R5}{2} \| \frac{1}{2C_{MNC1} \cdot s}\right)} \cdot R8$$

by changing the capacitance value of MOS capacitor MNC1, the high-frequency peak gain and zero-pole position of the pre-driver stage can be adjusted.

A negative temperature coefficient control voltage generating circuit V_NTC is composed of a transistor MN12 and a positive temperature coefficient current source $I_{PTAT}$;
a gate terminal of the transistor MN12 is connected to a common mode voltage terminal CFB;
a source terminal of the transistor MN12 is connected to a source-drain common terminal C_Contrl of the MOS capacitors MNC1 and MNC2 and a positive terminal of the thermal current source $I_{PTAT}$;
a negative terminal of the thermal current source $I_{PTAT}$ is grounded;
a drain terminal of the transistor MN12 is connected to the power supply voltage VDD.

Negative temperature coefficient control voltage generating circuit V_NTC is composed of transistor MN12 and positive temperature coefficient current source $I_{PTAT}$. When the operating temperature increases, the output current of the positive temperature coefficient current source $I_{PTAT}$ becomes larger. According to the saturation current formula of the transistor:

$$I_D = \frac{1}{2} u_n C_{OX} \frac{W}{L} (V_{GS} - V_{th})^2$$

Where: $u_n$ is the electron mobility;
$C_{OX}$ is the gate oxide capacitance per unit area;
W is the width of the transistor;
L is the length of the transistor;
$V_{GS}$ is the gate-source voltage;
$V_{th}$ is the threshold voltage.

As $I_D$ increases with temperature, $V_{GS}$ increases correspondingly, that is, the source voltage C_Contrl of transistor MN12 decreases linearly, the control of voltage through negative temperature coefficient is realized.

Since the changes of voltage at the CFB terminal with temperature is very small, when the control voltage is applied to the MOS capacitors MNC1 and MNC2 in the differential amplifier circuit with capacitive negative feedback, the voltage difference between the gate-source and gate-drain of the MOS capacitor increases with temperature. Therefore, the MOS capacitance increases linearly with temperature an its high-frequency peak gain increases proportionally with temperature.

Figure 11:
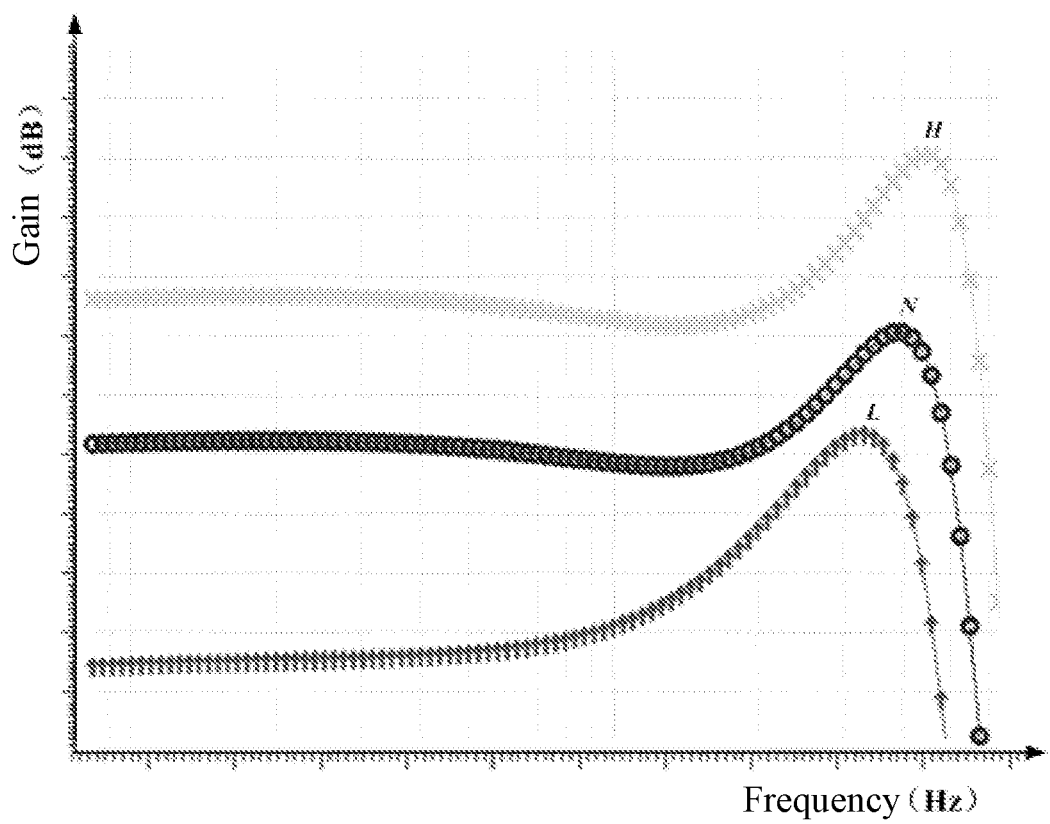
FIG. 11 is a simulation diagram showing the variation of the overall amplitude-frequency characteristic curve of the transimpedance amplifier at different temperatures.

By adjusting the source-level negative feedback capacitance value of the pre-driver circuit to generate high-frequency gain that varies with temperature, the bandwidth difference of the preamplifier under different temperature conditions is compensated, and the difference in the overall amplitude-frequency characteristic curve of the transimpedance amplifier becomes smaller at different temperatures, and the high bandwidth is achieved. The simulation results are shown in FIG. 11.

What is claimed is:
1. A high-speed transimpedance amplifier with bandwidth extension feature over full temperature range, characterized in that, comprising: a preamplifier TIA, a phase splitting stage PS, a pre-driver stage Pre-Drive, an output buffer BUFF and an offset cancelation circuit OC;
said preamplifier TIA comprises an amplifier-A and a transimpedance RF, said transimpedance RF is connected in parallel across an input and an output of said amplifier-A;
an output terminal TIA_OUT of said preamplifier TIA is connected to a non-inverting input terminal of said phase splitting stage PS;
a non-inverting output terminal of said phase splitting stage PS is connected to an inverting input of said pre-driver stage Pre-Drive; an inverting output terminal of said phase splitting stage PS is connected to a non-inverting input terminal of said pre-driver stage Pre-Drive;
a non-inverting output terminal of said pre-driver stage Pre-Drive is connected to an inverting input terminal of said output buffer BUFF; an inverting output of said pre-driver stage Pre-Drive is connected to a non-inverting input of said output buffer BUFF;

a non-inverting output terminal of said output buffer BUFF is simultaneously connected to an output pin OP of said transimpedance amplifier and one end of a resistor Ra, an inverting output terminal of said output buffer BUFF is simultaneously connected to an output pin ON of said transimpedance amplifier and one end of a resistor Rb, another end of said resistor Ra is connected to an inverting input terminal of an offset cancelation circuit OC, another end of said resistor Rb is connected to a non-inverting input terminal of an offset cancelation circuit OC, an output terminal of an offset cancelation circuit OC is connected to an inverting input terminal of the phase splitting stage PS; a capacitor C is connected in parallel between said inverting input terminal and said output terminal of said offset cancelation circuit OC;

said preamplifier TIA adopts a gate-drain voltage cancelation technology to expand its bandwidth, so that its −3 dB bandwidth is greater than twice a closed-loop bandwidth of a first-order TIA, said pre-driver stage Pre-Drive is used to drive the output buffer BUFF, by adjusting a source-level negative feedback capacitance value of said pre-driver stage Pre-Drive circuit to generate high-frequency gain that varies with temperature, compensate the difference in bandwidth of said preamplifier TIA under different temperature conditions.

2. The high-speed transimpedance amplifier with bandwidth extension feature over full temperature range according to claim 1, characterized in that, said preamplifier TIA comprises NMOS transistors MN1~MN5, PMOS transistor MP1, transimpedance RF, resistors R1~R3, capacitor C1 and variable resistor VR;

a gate terminal of said NMOS transistor MN1 is simultaneously connected to an input port TINP, one end of said variable resistor VR and one end of said transimpedance RF;

a drain terminal of said NMOS transistor MN1 is simultaneously connected to another end of said variable resistor VR, one end of said resistor R1 and a source terminal of said NMOS transistor MN2;

a gate terminal of said NMOS transistor MN2 is connected to a voltage bias port VB1;

a drain terminal of said NMOS transistor MN2 is simultaneously connected to one end of said resistor R2 and a gate terminal of said NMOS transistor MN5;

a drain terminal of said NMOS transistor MN3 is simultaneously connected to another end of said transimpedance RF, a source terminal of said NMOS transistor MN5, one end of said capacitor C1, one end of said resistor R3, and an output port TIA_OUT of said preamplifier TIA;

a drain terminal of said NMOS transistor MN5 is connected to a source terminal of said NMOS transistor MN4;

a gate terminal of said NMOS transistor MN4 is simultaneously connected to another end of said resistor R3, another end of said capacitor C1 and a drain terminal of said PMOS transistor MP1;

a gate terminal of said PMOS transistor MP1 is connected to a voltage bias port VB2;

source terminals of said NMOS transistors MN1 and MN3 are connected to GND;

another end of said resistor R2, another end of said resistor R1, a drain terminal of said NMOS transistor MN4 and a source terminal of said PMOS transistor MP1 are simultaneously connected to a voltage VDD;

by gate-drain voltage cancelation technique, a voltage difference between two terminals of a gate-drain equivalent capacitance Cpex of said NMOS transistor MN5 is 0, thereby a bandwidth of a main channel of said preamplifier is increased.

3. The high-speed transimpedance amplifier with bandwidth extension feature over full temperature range according to claim 1, characterized in that, said pre-drive stage circuit Pre-Drive comprises a differential amplifier circuit with capacitive negative feedback CNF_DA and a negative temperature coefficient control voltage generation circuit V_NTC;

said differential amplifier circuit with capacitive negative feedback CNF_DA comprises NMOS transistors MN6~MN11, resistors R5~R9, MOS capacitors MNC1 and MNC2;

a gate terminal of the NMOS transistor MN7 is simultaneously connected to a voltage bias port VB5 and a gate terminal of said NMOS transistor MN8;

a drain terminal of said NMOS transistor MN7 is simultaneously connected to a gate terminal of said MOS capacitor MNC1, one end of said resistor R5, one end of said resistor R6, and a source terminal of the NMOS transistor MN11;

a drain terminal of said NMOS transistor MN11 is connected to a source terminal of said NMOS transistor MN6;

a gate terminal of said NMOS transistor MN11 is connected to a signal positive phase input port INP;

a gate terminal of said NMOS transistor MN6 is simultaneously connected to a voltage bias port VB4 and a gate terminal of said NMOS transistor MN9;

a drain terminal of said NMOS transistor MN6 is simultaneously connected to an output port OUTN and one end of said resistor R8;

a drain terminal of said NMOS transistor MN8 is simultaneously connected to a gate terminal of said MOS capacitor MNC2, another end of said resistor R5, one end of said resistor R7, and a source terminal of said NMOS transistor MN10;

another end of said resistor R7 and another end of said resistor R6 are simultaneously connected to a common mode voltage terminal CFB;

a drain terminal of said NMOS transistor MN10 is connected to a source terminal of said NMOS transistor MN9;

a gate terminal of said NMOS transistor MN10 is connected to a signal inverting input port INN;

a drain terminal of said NMOS transistor MN9 is simultaneously connected to an output port OUTP and one end of said resistor R9;

MOS capacitors MNC1 and MNC2 have a common source terminal and a common drain terminal;

another ends of said resistors R8 and R9 are simultaneously connected to a power supply VDD;

source terminals of said NMOS transistors MN7 and MN8 are connected to GND;

a negative temperature coefficient control voltage generating circuit V_NTC is composed of a transistor MN12 and a positive temperature coefficient current source $I_{PTAT}$;

a gate terminal of said transistor MN12 is connected to a common mode voltage terminal CFB;

a source terminal of said transistor MN12 is connected to a source-drain common terminal C_Contrl of said MOS capacitors MNC1 and MNC2 and a positive terminal of said thermal current source I$_{PTAT}$;

a negative terminal of said thermal current source I$_{PTAT}$ is grounded;

a drain terminal of said transistor MN12 is connected to said power supply voltage VDD;

a capacitance value of a MOS capacitor of said differential amplifier circuit with capacitive negative feedback CNF_DA increases linearly with an increase of temperature, then a high-frequency peak gain of said pre-drive stage circuit Pre-Drive increases proportionally with the increase of temperature is realized;

by adjusting the negative feedback capacitor value of the pre-driver stage circuit Pre-Drive to generate high-frequency gain that changes with temperature, and compensate the bandwidth difference of the pre-amplifier TIA under different temperature conditions, a difference in an overall amplitude-frequency characteristic curve of said transimpedance amplifier becomes smaller at different temperatures, thereby achieving high bandwidth.

4. A method for bandwidth extension in a full temperature range, the method is realized based on the high-speed transimpedance amplifier with bandwidth extension characteristics over a full temperature range according to claim 1, characterized in that, said method comprises the step of: canceling said gate-drain voltage of said preamplifier TIA, specifically: a current injection unit composed of a cascode structure composed of NMOS transistors MN1 and MN2 and a resistor R1 is adopted to expand a bandwidth of a photoelectric interface link at an input end of said transimpedance amplifier TIA; and through said gate-drain voltage cancelation technology, an influence of said gate-drain equivalent capacitance Cpex of said NMOS transistor MN5 on said bandwidth of an output node of the preamplifier TIA is reduced, and said bandwidth of said main channel of said preamplifier is improved;

a gate voltage of said NMOS transistor MN5:

$$V_5 = V_x \cdot \frac{1 + (gm5 + gmb5) \cdot R0}{gm5 \cdot R0}$$

a source voltage of said NMOS transistor MN4:

$$V_4 = V_x \cdot \frac{gm4 \cdot (R0 + r5)}{1 + (gm4 + gmb4) \cdot (R0 + r5)}$$

where:
V$_x$ is a source voltage of MN5;
gm4, gm5 are transconductances of NMOS transistors MN4 and MN5 respectively;
gmb4, gmb5 are body transconductances of NMOS transistors MN4 and MN5 respectively;
RO is the output impedance of NMOS transistor MN3;
r5 is the internal resistance of the NMOS transistor MN5;
by designing the size of NMOS transistors MN4 and MN5 and then changing the corresponding transconductance and internal resistance so that V$_4$=V$_5$; a gate-to-drain equivalent capacitance Cpex of the NMOS transistor MN5=0 so as to eliminate the influence of the gate-to-drain equivalent capacitance Cpex of the NMOS transistor MN5.

5. The method for bandwidth extension in a full temperature range according to claim 4, characterized in that, said method further comprises the steps of: adjusting a high frequency gain and pole zero position of said pre-driver stage Pre-Drive, specifically:

neglecting an influence of transistors MN6 and MN9, a transfer function of said differential amplifier circuit with capacitive negative feedback CNF_DA in said pre-driver stage Pre-Drive is:

$$H(s) = \frac{gm11}{C_L} \cdot \frac{s + \frac{1}{2R5 \cdot C_{MNC1}}}{\left(s + \frac{1 + gm11 \cdot R5/2}{2R5 \cdot C_{MNC1}}\right)\left(s + \frac{1}{R8 \cdot C_L}\right)}$$

where: gm11 is the transconductance of the NMOS transistor MN11,
C$_L$ is the output node capacitance of OUTP and OUTN,
C$_{MNC1}$ is the capacitance value of the MOS capacitor;
then: the zero point of the differential amplifier circuit with capacitive negative feedback CNF_DA is:

$$\omega_z = \frac{1}{2R5 \cdot C_{NMC1}}$$

the first pole of the differential amplifier circuit with capacitive negative feedback CNF_DA is:

$$\omega_{p1} = \frac{1}{R8 \cdot C_L}$$

the second pole of the differential amplifier circuit with capacitive negative feedback CNF_DA is:

$$\omega_{p2} = \frac{1 + gm11 \cdot R5/2}{2R5 \cdot C_{MNC1}}$$

the high-frequency peak gain of the differential amplifier circuit with capacitive negative feedback CNF_DA is:

$$A0 = \frac{gm11}{1 + gm11\left(\frac{R5}{2} \middle\| \frac{1}{2C_{MNC1} \cdot s}\right)} \cdot R8$$

by changing the capacitance value of MOS capacitor MNC1, the high-frequency peak gain and zero-pole position of the pre-driver stage can be adjusted.

6. A method for bandwidth extension in a full temperature range, the method is realized based on the high-speed transimpedance amplifier with bandwidth extension characteristics over a full temperature range according to claim 2, characterized in that, said method comprises the step of: canceling said gate-drain voltage of said preamplifier TIA, specifically: a current injection unit composed of a cascode structure composed of NMOS transistors MN1 and MN2 and a resistor R1 is adopted to expand a bandwidth of a photoelectric interface link at an input end of said transimpedance amplifier TIA; and through said gate-drain voltage cancelation technology, an influence of said gate-drain equivalent capacitance Cpex of said NMOS transistor MN5 on said bandwidth of an output node of the preamplifier TIA is reduced, and said bandwidth of said main channel of said preamplifier is improved;

a gate voltage of said NMOS transistor MN5:

$$V_5 = V_x \cdot \frac{1 + (gm5 + gmb5) \cdot R0}{gm5 \cdot R0}$$

a source voltage of said NMOS transistor MN4:

$$V_4 = V_x \cdot \frac{gm4 \cdot (R0 + r5)}{1 + (gm4 + gmb4) \cdot (R0 + r5)}$$

where:
$V_x$ is a source voltage of MN5;
gm4, gm5 are transconductances of NMOS transistors MN4 and MN5 respectively;
gmb4, gmb5 are body transconductances of NMOS transistors MN4 and MN5 respectively;
R0 is the output impedance of NMOS transistor MN3;
r5 is the internal resistance of the NMOS transistor MN5;
by designing the size of NMOS transistors MN4 and MN5 and then changing the corresponding transconductance and internal resistance so that $V_4=V_5$; a gate-to-drain equivalent capacitance Cpex of the NMOS transistor MN5=0 so as to eliminate the influence of the gate-to-drain equivalent capacitance Cpex of the NMOS transistor MN5.

7. The method for bandwidth extension in a full temperature range according to claim 6, characterized in that, said method further comprises the steps of: adjusting a high frequency gain and pole zero position of said pre-driver stage Pre-Drive, specifically:

neglecting an influence of transistors MN6 and MN9, a transfer function of said differential amplifier circuit with capacitive negative feedback CNF_DA in said pre-driver stage Pre-Drive is:

$$H(s) = \frac{gm11}{C_L} \cdot \frac{s + \frac{1}{2R5 \cdot C_{MNC1}}}{\left(s + \frac{1 + gm11 \cdot \frac{R5}{2}}{2R5 \cdot C_{MNC1}}\right)\left(s + \frac{1}{R8 \cdot C_L}\right)}$$

where: gm11 is the transconductance of the NMOS transistor MN11,
$C_L$ is the output node capacitance of OUTP and OUTN,
$C_{MNC1}$ is the capacitance value of the MOS capacitor;
then: the zero point of the differential amplifier circuit with capacitive negative feedback CNF_DA is:

$$\omega_z = \frac{1}{2R5 \cdot C_{NMC1}}$$

the first pole of the differential amplifier circuit with capacitive negative feedback CNF_DA is:

$$\omega_{p1} = \frac{1}{R8 \cdot C_L}$$

the second pole of the differential amplifier circuit with capacitive negative feedback CNF_DA is:

$$\omega_{p2} = \frac{1 + gm11 \cdot \frac{R5}{2}}{2R5 \cdot C_{MNC1}}$$

the high-frequency peak gain of the differential amplifier circuit with capacitive negative feedback CNF_DA is:

$$A0 = \frac{gm11}{1 + gm11\left(\frac{R5}{2} \middle\| \frac{1}{2C_{MNC1} \cdot s}\right)} \cdot R8$$

by changing the capacitance value of MOS capacitor MNC1, the high-frequency peak gain and zero-pole position of the pre-driver stage can be adjusted.

8. A method for bandwidth extension in a full temperature range, the method is realized based on the high-speed transimpedance amplifier with bandwidth extension characteristics over a full temperature range according to claim 3, characterized in that, said method comprises the step of: canceling said gate-drain voltage of said preamplifier TIA, specifically: a current injection unit composed of a cascode structure composed of NMOS transistors MN1 and MN2 and a resistor R1 is adopted to expand a bandwidth of a photoelectric interface link at an input end of said transimpedance amplifier TIA; and through said gate-drain voltage cancelation technology, an influence of said gate-drain equivalent capacitance Cpex of said NMOS transistor MN5 on said bandwidth of an output node of the preamplifier TIA is reduced, and said bandwidth of said main channel of said preamplifier is improved;

a gate voltage of said NMOS transistor MN5:

$$V_5 = V_x \cdot \frac{1 + (gm5 + gmb5) \cdot R0}{gm5 \cdot R0}$$

a source voltage of said NMOS transistor MN4:

$$V_4 = V_x \cdot \frac{gm4 \cdot (R0 + r5)}{1 + (gm4 + gmb4) \cdot (R0 + r5)}$$

where:
$V_x$ is a source voltage of MN5;
gm4, gm5 are transconductances of NMOS transistors MN4 and MN5 respectively;
gmb4, gmb5 are body transconductances of NMOS transistors MN4 and MN5 respectively;
R0 is the output impedance of NMOS transistor MN3;
r5 is the internal resistance of the NMOS transistor MN5;
by designing the size of NMOS transistors MN4 and MN5 and then changing the corresponding transconductance and internal resistance so that $V_4=V_5$; a gate-to-drain equivalent capacitance Cpex of the NMOS transistor MN5=0 so as to eliminate the influence of the gate-to-drain equivalent capacitance Cpex of the NMOS transistor MN5.

9. The method for bandwidth extension in a full temperature range according to claim 8, characterized in that, said method further comprises the steps of: adjusting a high frequency gain and pole zero position of said pre-driver stage Pre-Drive, specifically:

neglecting an influence of transistors MN6 and MN9, a transfer function of said differential amplifier circuit with capacitive negative feedback CNF_DA in said pre-driver stage Pre-Drive is:

$$H(s) = \frac{gm11}{C_L} \cdot \frac{s + \frac{1}{2R5 \cdot C_{MNC1}}}{\left(s + \frac{1 + gm11 \cdot \frac{R5}{2}}{2R5 \cdot C_{MNC1}}\right)\left(s + \frac{1}{R8 \cdot C_L}\right)}$$

where: gm11 is the transconductance of the NMOS transistor MN11,
$C_L$ is the output node capacitance of OUTP and OUTN,
$C_{MNC1}$ is the capacitance value of the MOS capacitor;
then: the zero point of the differential amplifier circuit with capacitive negative feedback CNF_DA is:

$$\omega_z = \frac{1}{2R5 \cdot C_{NMC1}}$$

the first pole of the differential amplifier circuit with capacitive negative feedback CNF_DA is:

$$\omega_{p1} = \frac{1}{R8 \cdot C_L}$$

the second pole of the differential amplifier circuit with capacitive negative feedback CNF_DA is:

$$\omega_{p2} = \frac{1 + gm11 \cdot \frac{R5}{2}}{2R5 \cdot C_{MNC1}}$$

the high-frequency peak gain of the differential amplifier circuit with capacitive negative feedback CNF_DA is:

$$A0 = \frac{gm11}{1 + gm11\left(\frac{R5}{2} \middle\| \frac{1}{2C_{MNC1} \cdot s}\right)} \cdot R8$$

by changing the capacitance value of MOS capacitor MNC1, the high-frequency peak gain and zero-pole position of the pre-driver stage can be adjusted.

\* \* \* \* \*